United States Patent
Jones et al.

(10) Patent No.: US 6,891,412 B1
(45) Date of Patent: May 10, 2005

(54) LOW NOISE FILTER

(75) Inventors: Christopher Geraint Jones, Maidstone (GB); Christophe Claude Beghein, West Malling (GB)

(73) Assignee: Analog Devices, Inc., Norwood, MA (US)

( * ) Notice: Subject to any disclaimer, the term of this patent is extended or adjusted under 35 U.S.C. 154(b) by 6 days.

(21) Appl. No.: 10/319,975

(22) Filed: Dec. 16, 2002

(51) Int. Cl.[7] .............................................. H03L 7/08
(52) U.S. Cl. ......................... 327/154; 327/156; 331/17
(58) Field of Search .............................. 327/156, 157, 327/148, 147, 553, 554, 552, 558; 331/17

(56) References Cited

U.S. PATENT DOCUMENTS 5,770,962 A    6/1998   Aebischer
6,169,457 B1 *  1/2001  Ichimaru ...................... 331/17
6,434,206 B1 *  8/2002  Yu ............................... 375/376
6,549,599 B2 *  4/2003  Momtaz ...................... 375/376
6,600,351 B2 *  7/2003  Bisanti et al. ............... 327/157

FOREIGN PATENT DOCUMENTS

WO    WO 90/12452    10/1990

OTHER PUBLICATIONS

International Search Report.

* cited by examiner

Primary Examiner—Dinh T. Le
(74) Attorney, Agent, or Firm—Wolf, Greenfield & Sacks, P.C.

(57) ABSTRACT

An RC equivalent filter is provided in which the resistor is replaced by a voltage source (40) and a capacative divider. With suitable control the voltage occurring across a capacitor (44) in the divider can reproduce that which would occur across at the output of the original RC filter, but with much lower noise.

10 Claims, 7 Drawing Sheets

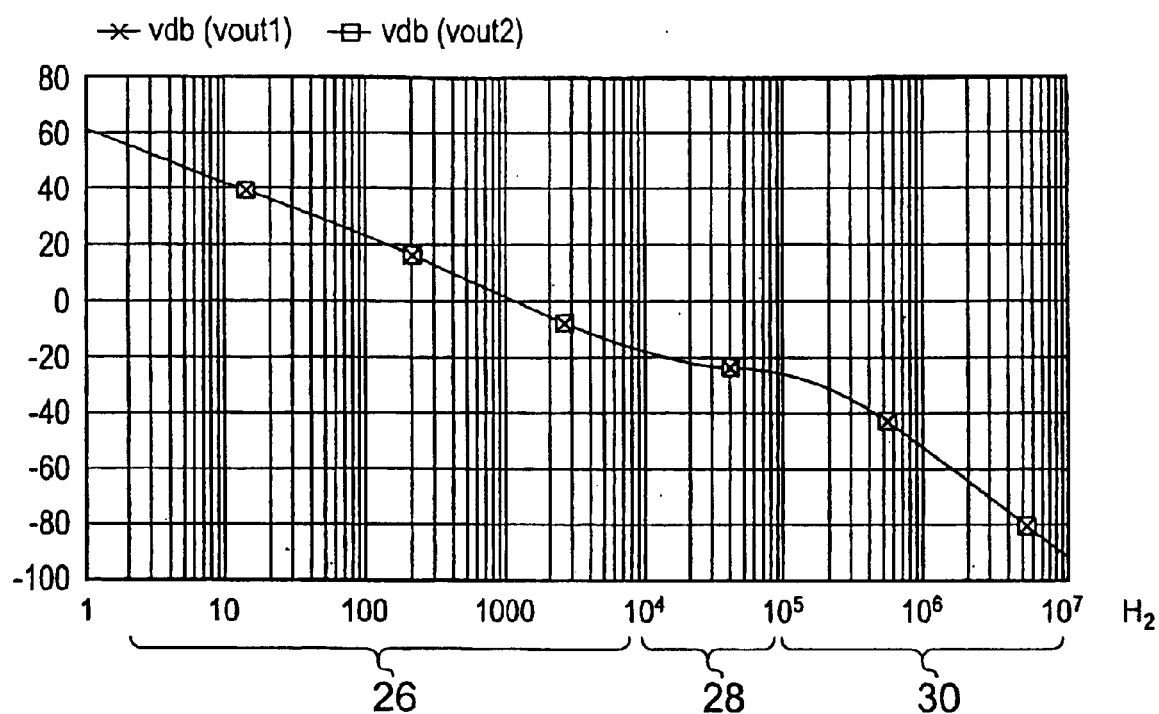
Fig. 2 -- Prior Art --
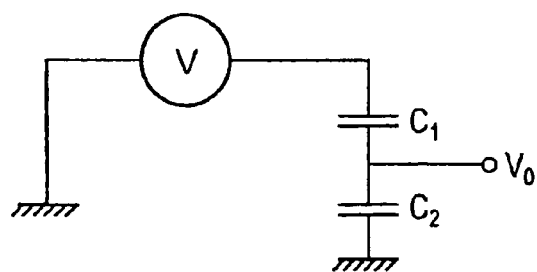
Fig. 11

LOW NOISE FILTER

BACKGROUND OF THE INVENTION

The present invention relates to a low noise filter, and in particular to a filter suitable for inclusion within an integrated circuit.

It is often desired to implement a filter function within an electronic circuit. Furthermore, with increasing trends towards miniaturisation it is generally desired that the implementation of the filter should be as physically small as possible. However, other considerations apply to filter design, a significant one of which is the noise generated by the filter.

An application in which filters must meet strict noise requirements is that of a phase locked loop (PLL) synthesiser within, for example, a mobile telephone. An example of an existing filter design for such an application is shown in FIG. 1 of the accompanying drawings. The filter, generally indicated 2, in FIG. 1 is, intended to be driven from a charge pump 4. The filter can be considered as generally comprising two cascaded stages. The first stage 6 comprises a capacitor 8 in series with a resistor 10 between an input node 12 and a ground connection 14. This series combination is shunted by a further capacitor 16. The second stage, generally indicated 20 follows the first stage and comprises a resistor 22 in series with a capacitor 24, and an output node taken from the connection between the resistor 22 and the capacitor 24.

The frequency response of the filter shown in FIG. 1 is schematically illustrated in FIG. 2. It can be seen that the amplitude of the output falls substantially uniformly over a first frequency range 26, which is primarily due to the action of the first stage 6. The rate of decrease then flattens off over a second region 28 corresponding to the magnitude of the impedance of the capacitor 8 now becoming equal to or smaller than the impedance of the resistor 10, and finally the attenuation increases again over a region 30. Within region 30 the attenuation increases for two regions. Firstly the impedance of capacitor 16 becomes low compared to the impedance of the resistor 10, and consequently the overall impedance of the first stage 6 of the filter begins to decrease again as a function of frequency. Secondly the impedance of the capacitor 24 in the second stage 20 of the filter becomes less than the impedance of the resistor 22.

Even though the components are passive, the resistors represent a source of thermally induced noise. This noise, known as Johnson noise can be expressed as:

$$D(V_f^2) = 4k\,TRdf$$

Where $D(V_f^2)$ equals the mean square voltage fluctuations in a frequency range df
Where k is boltsmans constant,
T is absolute temperature,
R is resistance.

It is well known that for a single stage resistor-capacitor (RC) filter the break point occurs at $$\frac{1}{2\pi RC}.$$

Referring to FIG. 1 again, the capacitor 8 has a value of 27 nanofarads which is so large that it would not be economical to fabricate it on an integrated circuit because of the amount of the die area which would be required. Furthermore, if the capacitor is external to the integrated circuit which contains the associated circuitry, pins will be required in order to connect the capacitor which may incur an increased packaging cost. An external capacitor of that value and of sufficient accuracy and stability for use in a PLL filter has a cost which may be a significant proportion of the total cost of the PLL. It is desirable to reduce the number of external components because physical size and assembly cost are significant factors in the design of many products. For all of these reasons it would be desirable for the capacitor values in the filter to be reduced sufficiently that all of the components could be included in an integrated circuit. If all of the capacitor values in an RC filter are decreased by a given factor X, the impedance of those capacitors at all frequencies will increase by the same factor X, and in order for the output of the filter to remain the same as the original circuit, all of the resistors must be increased by the factor X as well as any current sources being reduced by the factor X. If a resistor is increased by the factor X, the Johnson noise voltage of that resistor will increase by a factor equal to the square root of X. The noise of the original filter circuit of FIG. 1 may not be increased without degrading the performance of the circuit in which it operates, so a circuit having the form of FIG. 1 is not suitable for fabrication within an integrated circuit.

SUMMARY OF THE INVENTION

According to a first aspect of the present invention there is provided a filter having a first input for receiving a current from a charge pump and an output, and wherein the filter further comprises a second input for receiving a voltage from a voltage source, the voltage from the voltage source being proportional to the current from the charge pump, a first capacitor connected between the output and a ground connection, a second capacitor connected between the second input and the output, and a connection between the first input and the output.

It is thus possible to provide an improved filter design suitable for fabrication within an integrated circuit. The performance of the resistor in series with a capacitor within an RC filter can be-replicated by a capacitive divider in combination with a voltage source. This creates a low noise alternative to using a real resistor and consequently frees the designer to choose other values for the other components within the RC filter, and in particular enables the capacitor size to be significantly reduced.

Advantageously the first and second capacitors are arranged such that any noise developed by the voltage source is divided down by a potential divider formed by the capacitors. This further enhances the noise performance of the filter.

Advantageously the filter is a multistage filter. Where the filter would normally be followed by a further RC filter, this further filter may advantageously be placed within the first and second input paths of the filter such that noise generated by resistors in these second stage filters is divided down by the capacitive divider within the filter.

According to a second aspect of the present invention, there is provided an integrated circuit including a filter constituting an embodiment of the first aspect of the present invention.

According to a third aspect of the present invention there is provided a filter having an input for receiving current from a current source, and an output, wherein the filter comprises a capacitor of a RC filter circuit in co-operation with a first circuit configuration functionally replacing the resistor of the RC filter circuit, wherein the first circuit configuration comprises a voltage source in series with a capacitor and wherein the magnitude of the voltage produced by the voltage source is proportional to the current that would flow through the resistor.

It is thus possible to replace a combination of a resistor and capacitor arranged in series, and which can notionally be regarded as being situated between two terminals, with a combination of two capacitors and a voltage source wherein the first capacitor is connected between the two terminals and the second capacitor is in series with the voltage source and the combination of the second capacitor and the voltage source is in parallel with the first capacitor or is connected between the two terminals.

According to a fourth aspect of the present invention there is provided a circuit for replicating the function of a combination of resistor in series with a capacitor, the combination having first and second terminals within a filter circuit, wherein the circuit comprises a voltage source serially connected to first and second capacitors and terminals for connection to the circuit occur across the second capacitor, and wherein the output of the voltage source is responsive to the current that would flow within the resistor and produces a voltage proportional to the expected current such that a voltage appearing across the second capacitor is equivalent to the voltage that would have been developed across the original series combination of resistor and capacitor.

According to a fifth aspect of the present invention, there is provided a filter including a first component which is a source of noise, wherein a signal affected by the noise from the first component is passed through an attenuator comprising capacitors in series so as to attenuate the noise from the first component.

According to a sixth aspect of the present invention there is provided a filter driven from a current source, wherein the filter comprises an input node for connection to the current source and an output node, and wherein a resistor is connected between the input node and the output node, a capacitor is connected between the input node and ground, and a further stage comprising at least a second capacitor is connected between the output node and ground.

BRIEF DESCRIPTION OF THE DRAWINGS

The present invention will further be described, by way of example, with reference to the accompanying drawings, in which:

FIG. 2 shows the amplitude response of the circuit shown in FIG. 1;

FIG. 4a illustrates a current pulse, FIG. 4b illustrates the voltage occurring across the resistor, and FIG. 4c illustrates the voltage occurring across the capacitor, and FIG. 4d shows the sum of the voltages across the resistor and capacitor;

FIG. 11 is a circuit diagram for consideration during analysis of the present invention.

DESCRIPTION OF PREFERRED
EMBODIMENTS OF THE INVENTION

Figure 3:
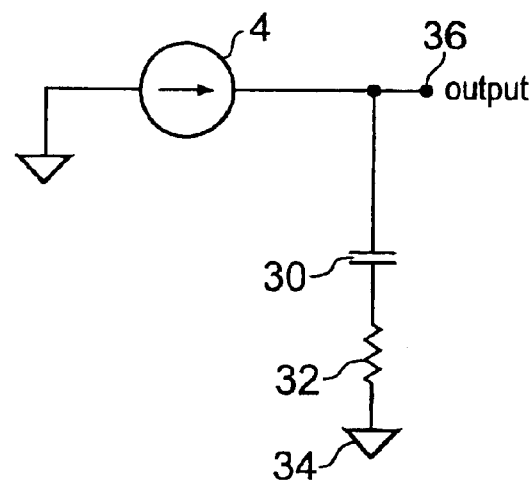
FIG. 3 shows a simplified low pass filter arrangement.

In order to understand how a filter containing a resistor may be replaced by a filter containing a combination of a voltage source and one or more capacitors, it is useful to consider a simple case such as that shown in FIG. 3. The simplified arrangement shown in FIG. 3 comprises a current source 4 which is operable to supply or sink a predetermined current 1 or not to supply a current at all. This configuration is well known and used extensively in PLL circuitry. The current source is under control of a switching circuit and it is desired to obtain a filtered signal derived from the times for which the current source is on. In order to achieve this, a capacitor and resistor combination 30 and 32 arranged in series connects the output of the current source 4 a ground terminal 34.

Figure 4A:
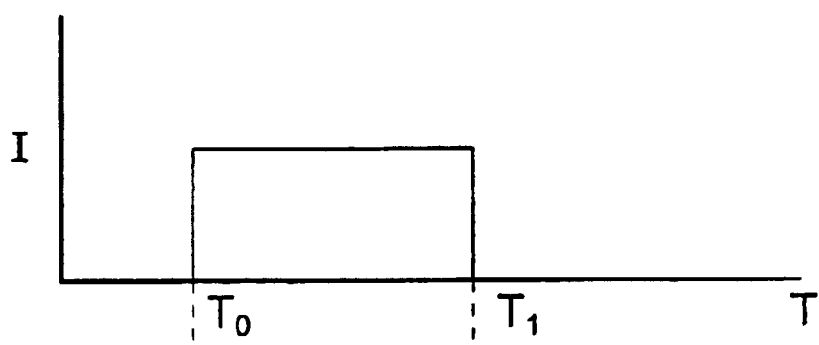
FIGS. 4a to 4d schematically illustrate voltages occurring within the arrangement shown in FIG. 3 in response to a current pulse, and in particular
Figure 4B:
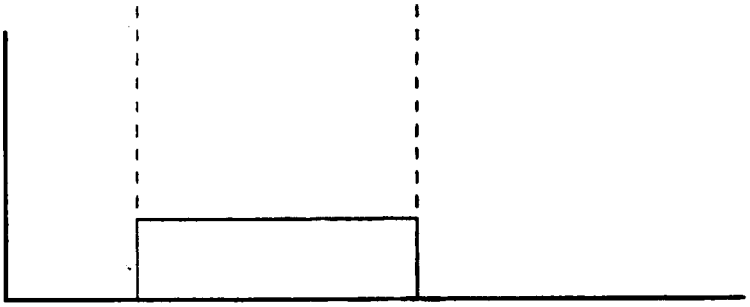
Figure 4C:
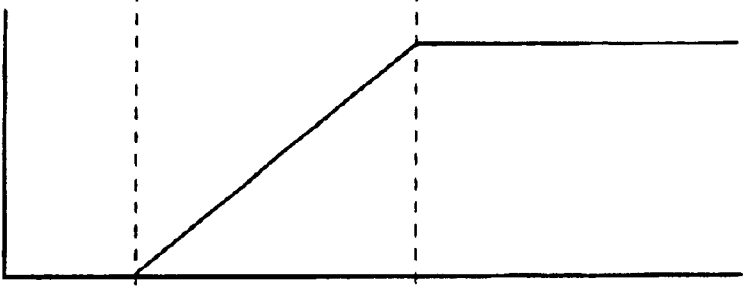
Figure 4D:
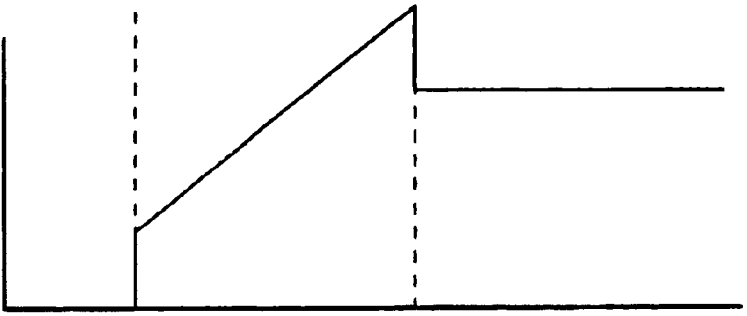

Now suppose, as shown in FIG. 4a, that the current source is switched on to provide a current 1 in the time period spanning $T_0$ to $T_1$. If, for simplicity, we assume that no or negligible current flows from the output 36 of the circuit shown in FIG. 3, then we know that the current 1 flows in both the capacitor 30 and the resistor 32. By application of ohms law, V=IR, it is apparent that a pulsed voltage proportional to the current will occur across the resistor, as shown in FIG. 4b. For the capacitor, the voltage occurring across the capacitor will be the time integral of the current flowing through it, and since the current is constant, the voltage occurring across the capacitor will ramp-up as shown in FIG. 4c and remain at a ramped value (at least in the ideal case) once the current flow ceases. The sum of these voltages is shown in FIG. 4d.

The inventor has realised that the functionality of the RC combination of FIG. 3 where it is driven from a current source can be replaced by a combination of capacitors and a voltage source. Such a combination accurately replicates both the response of the capacitor, as illustrated in FIG. 4c and as might be expected. However the combination can also replicate the voltage component resulting from the contribution of the resistor as illustrated in FIG. 4b. This is more surprising and will be further considered with-reference to FIG. 11. Analysis of the circuit shows that the voltage $V_0$ is given by $$V \frac{ZC_2}{(ZC_1 + ZC_2)}$$

where $ZC_1$ represents the impedance of the capacitor $C_1$ and $ZC_2$ represents the impedance of the capacitor $C_2$. Using well known substitutions $$ZC_1 = \frac{-1}{J\omega C_1} \text{ and } ZC_2 = \frac{-1}{J\omega C_2}.$$

It is worth noting that the term ω cancels out in both the numerator and denominator and hence this voltage divider function occurs ideally at all frequencies extending down towards zero. Thus the response of the resistor at all frequencies (even down to DC) can be reproduced.

Figure 5:
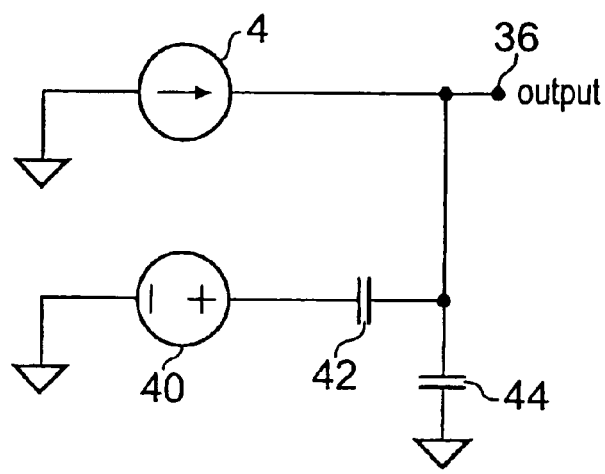
FIG. 5 shows a circuit configuration constituting an embodiment of the present invention and equivalent to that shown in FIG. 3.

Thus the circuit configuration shown in FIG. 11 can be used to replace the series combination of resistor 32 and capacitor 30 in FIG. 3 to achieve the configuration shown in FIG. 5. Thus the equivalent circuit shown in FIG. 5 comprises the current source 4 connected to the output node 36, and a voltage source 40 connected to the output node 36 via a capacitor 42, and a second capacitor 44 connecting the output node 36 to ground. In FIG. 3, the rate at which the output voltage would ramp up in response to a long pulse at the input will be determined by the magnitude of the current source divided by the value of capacitor 30. The impedance presented to the current source in FIG. 5 is the impedance of the parallel combination of capacitor 42 and capacitor 44. In response to a long pulse at the input, it is desirable that the circuit of FIG. 5 produces an output which ramps up in an identical manner to the output of FIG. 3. In order to achieve this, (and assuming for the moment that the current sources in the two circuits are identical) the values of capacitors 42 and 44 must add to a value which is equal to the value of capacitor 30. If the voltage source 40 switches on and off with the current source 4 and has a voltage which is correctly proportional thereto then the arrangement shown in FIG. 5 can completely replicate circuit functionality of that shown in FIG. 3.

With regard to FIG. 5 it will be seen that any noise generated by the voltage source 40 will be divided down by a potential divider formed by the capacitors 42 and 44 before it appears at the output 36. Furthermore, because in practice the ratio between these capacitors is large (capacitor 44 is much larger than capacitor 42) and hence only a small fraction of the noise occurring at the voltage source 40 appears across a capacitor 44, then the noise performance of the voltage source is not very critical. In the circuit shown in FIG. 3, the noise of the resistor appears at the output of the filter and if the capacitor is decreased then the value of the resistor must be increased to keep the RC product constant otherwise the frequency response will be altered. If the capacitor is decreased and the resistor is increased the noise voltage present at the output of the filter increases to an amount which is not acceptable. In contrast, in the arrangement shown in FIG. 5 all of the capacitor values can be scaled down by the same factor and provided that the charge pump current is also scaled down by the same factor the frequency response to the circuit is unaffected and the noise performance does not get significantly worse. This offers the potential that this filter can be fabricated on an integrated circuit Because there is no resistor in this circuit the noise performance is much better than that of the original circuit shown in FIG. 3. Thus it is possible to create a zero in a filter response by using a capacitive divider instead of a resistor. This can bring significant noise and component size benefits.

Figure 1:
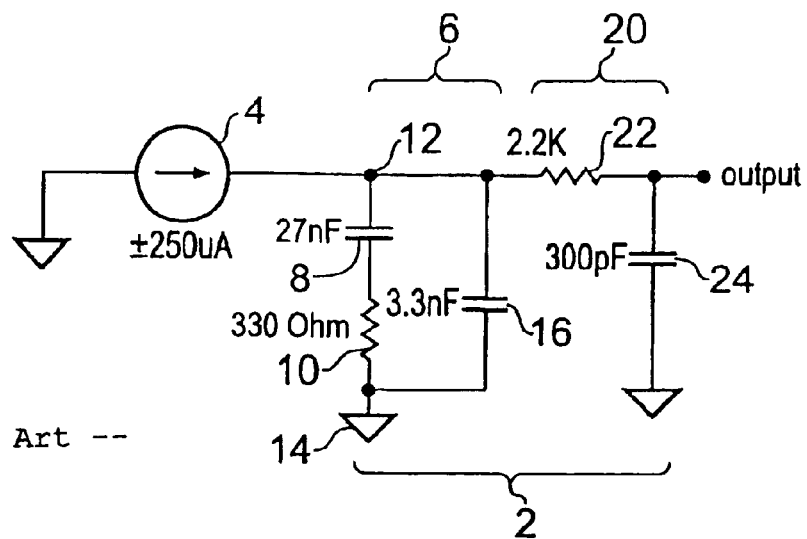
FIG. 1 is a circuit diagram of a filter circuit within a phased locked loop.

The arrangement shown in FIG. 3 is much simplified compared to that shown in FIG. 1. The next level of approximation is to replicate the functionality of the capacitor 16 and this is shown in FIG. 6 where the capacitor 46 is in parallel with the capacitor 30 and resistor 32 in much the same way that in FIG. 1 the capacitor 16 is in parallel with the capacitor 8 and resistor 10.

Figure 6:
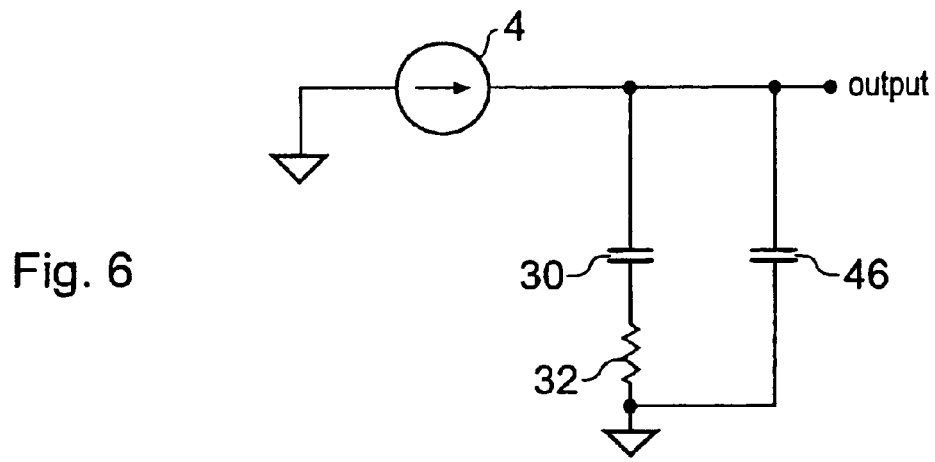
FIG. 6 shows a further modification to the circuit shown in FIG. 3 replicating the first stage of the filter shown in FIG. 1.
Figure 7:
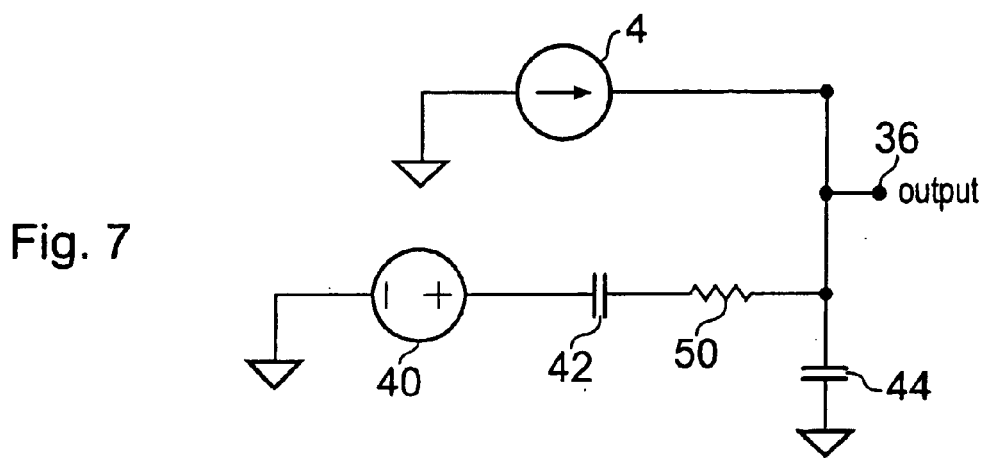
FIG. 7 shows a circuit constituting an embodiment of the present invention and equivalent to the circuit shown in FIG. 6.

In FIG. 6 the addition of the further capacitor adds another pole in the frequency response. In the circuit of FIG. 5, the same effect can be achieved by adding a resistor, as shown in FIG. 7. The resistor 50 is interposed between the capacitor 42 and the output node 36. Because the capacitor 42 connected between the voltage source and resistor 50 has a small value, whereas the capacitor between the output 36 and ground has a much larger value, the Johnson noise produced by the resistor 50 is attenuated by a large ratio when measured at the output of the filter. Thus the circuit configuration also allows resistor noise to be significantly attenuated. The ratio between the capacitor values of the capacitors 42 and 44 is substantially proportional to the ratio by which the noise voltage of the resistor is attenuated whereas noise voltage from the resistor is substantially proportional to the square root of its resistance. This means that the resistor value can be increased a lot even if the ratio of the capacitor divider is not very high and that noise will still remain acceptable. As noted above, the noise from resistor 50 is attenuated by the capacitive divider formed by capacitors 42 and 44. This can be more easily seen by swapping the positions of resistor 50 and capacitor 42. This can be done as they are in series. The current source 4 presents a theoretically infinite impedance so that we effectively see the normal capacitive divider configuration with the resistor 50 being connected to one end of the divider and the other end being connected to ground.

Finally, comparing the current circuit configuration of FIG. 6 with the original circuit as shown in FIG. 1, it can be seen that an extra RC filter section provided by the resistor 22 and capacitor 24 exists at the output stage of the filter. In order to fully replicate the functionality and response of the circuit shown in FIG. 1 this feature must be added to the circuit of FIG. 7. If the low pass section were added at the output of the filter then the noise contribution from the resistor would be unacceptably high due to the high resistor value necessary to provide the correct frequency response with a capacitor value small enough to be integrated within an integrated circuit. Also, the second stage of the filter inevitably loads the first stage of the filter. If the loading effect is to be kept relatively small, then the impedance presented to the first section of the filter by the second section of the filter must be large compared to the output impedance of the first section of the filter. In practice that means that the value of the capacitor in the second filter stage has to be much smaller than the value of the capacitor 44 in FIG. 7. Thus the capacitor of the second stage of the filter must be many times smaller than capacitor 44 which itself must be small enough to fabricate within an integrated circuit. This means that the resistor would necessarily have a very large value and would be noisy. In order to reduce the amount of noise from this low pass section which appears at the output, it is advantageous to place it before the other section of the filter. Because the filter circuit has two input paths by which the input signal enters the filter, namely the current source path and the voltage source path, then the new RC filter section needs to be added in both paths. In order to produce the correct low pass filtering action, in fact an RC section is introduced into the voltage path, comprising resistor 60 interposed between the voltage source 40 and the capacitor 42 and a capacitor 62 extending between the node formed by the connection between the resistor 60 and the capacitor 42 and the ground. Furthermore a CR section comprising a resistor 70 interposed between the output of the current source 4 and the output node 36 and a capacitor 72 interconnected between the output of the current source 4 and the ground is provided in the input path from the current source. This ensures that the correct filter response is obtained.

The noise from resistor 60 is attenuated by a capacitive divider formed by capacitor 42 and capacitor 44 before appearing at the output of the filter. The noise from resistor 70 is effectively attenuated by a capacitive divider formed by capacitors 72 and 44 before it appears at the output of the filter. The action of this second capacitive divider is not immediately obvious but can be seen to be so because the current source 4 presents a high impedance and can effectively be disregarded form the point of view of noise analysis. This leaves the resistor 70 in series with the capacitor 72 and these can be swapped over without affecting the noise performance of the circuit. However, as noted before, this now gives a conventional capacitive divider configuration with the resistor being connected to one end of the divider and the other end being connected to ground. This reduces the noise voltage greatly and allows high value resistors to be used which in turn allows small value capacitors to be used thereby allowing the circuit to be fabricated on an integrated circuit.

Figure 8:
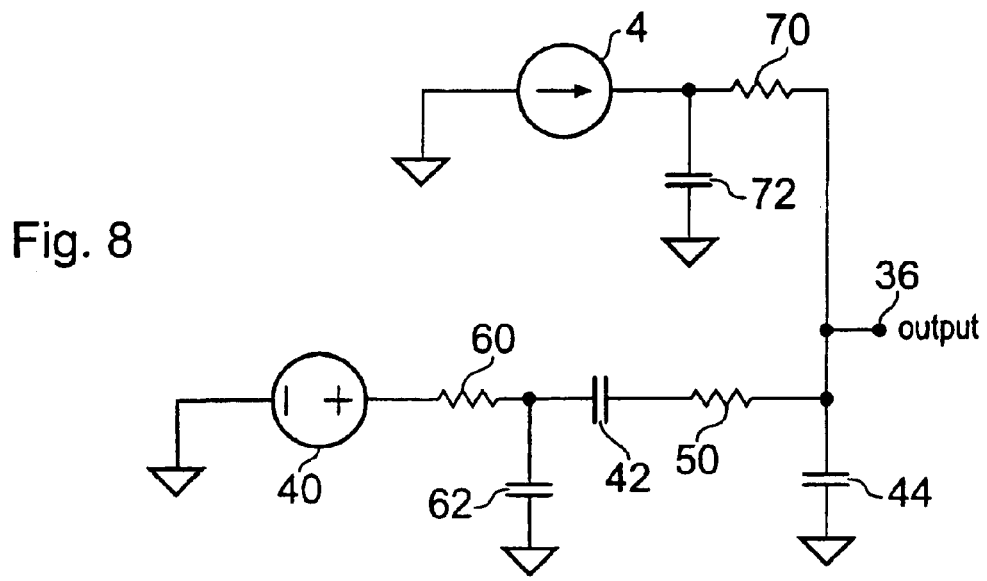
FIG. 8 shows a circuit constituting an embodiment of the present invention and equivalent to the circuit shown in FIG. 1.
Figure 9:
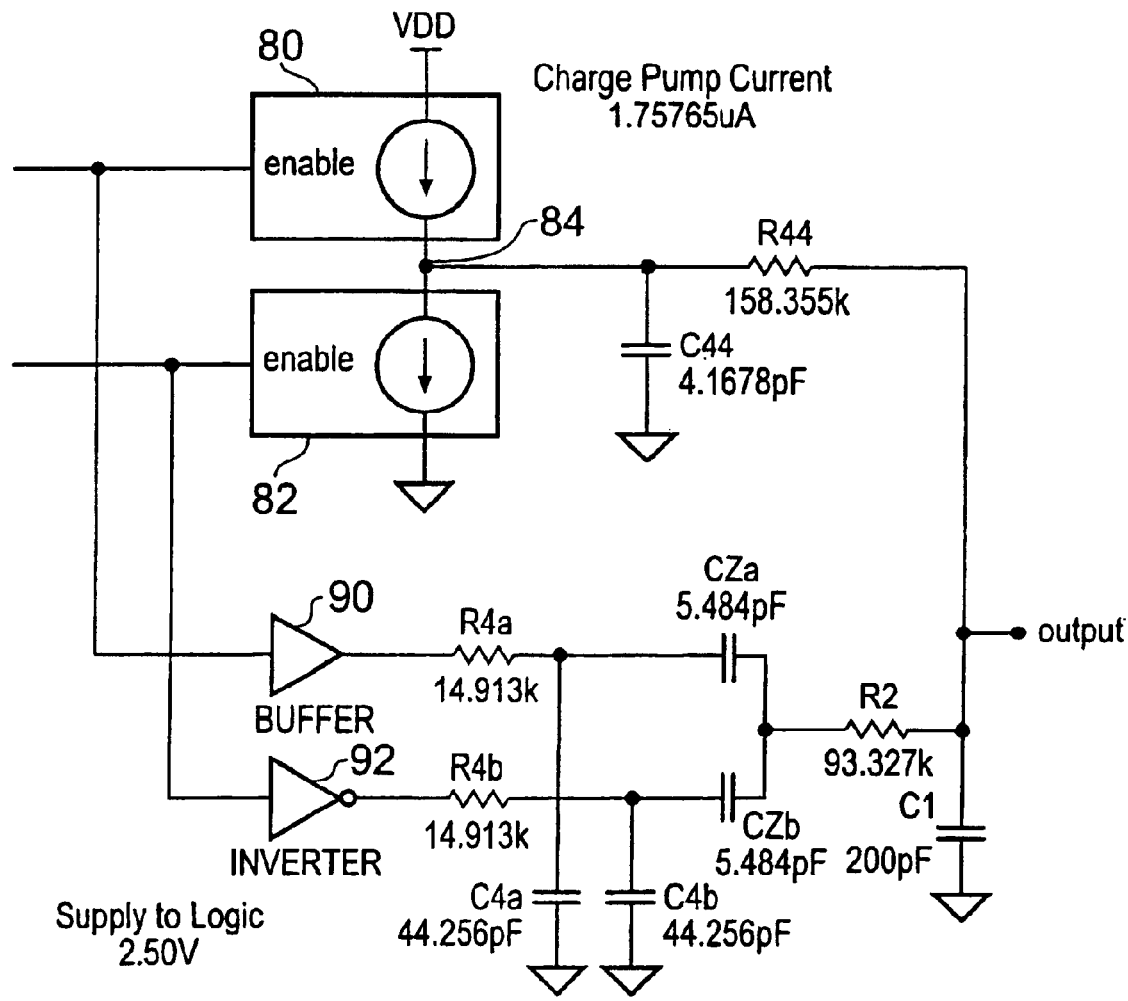
FIG. 9 shows an embodiment of the present invention equivalent to the circuit shown in FIG. 1.

FIG. 9 illustrates a circuit arrangement equivalent to that of FIG. 1 but having a topology based on to that of FIG. 8. The circuit of FIG. 9 is intended to replace the circuit of FIG. 1 in the case where the input current signal of FIG. 1 would have consisted of either no current or a positive current pulse of constant magnitude or a negative current pulse of the same magnitude. Although the circuit of FIG. 9 is limited to this kind of application, the invention as shown in FIG. 8 could be used with any kind of input waveform including analogue signals and is not limited to pulses. It can be seen that the charge pump 4 is implemented as a first current source 80 in series with a matched current sink 82 and the input to the filter is formed by a node 84 between the current source 80 and the current sink 82. The current source 80 and the current sink 82 are switched on and off by digital signals from a phase detector in the PLL and it is the difference between their respective switch on and switch off times which either drives current into or sucks current from the current input of the filter. It can be noted that the significant reduction the charge pump current has occurred. In the circuit arrangement shown in FIG. 1 the current amounted to 250 $\mu$A whereas in the circuit shown in FIG. 9 the current has been reduced to 1.757 $\mu$A.

The voltage source 40 is implemented by a logic buffer 90 and a logic inverter 92 which are driven from the enable signals for the current source 80 and the current sink 82, respectively. The buffer and inverter can be standard CMOS logic gates which work very well in this application, however other types of logic or other types of voltage signal source could be made to perform this function. In order to use the circuit implementation shown in FIG. 8, it is necessary to generate a voltage which is proportional to the charge pump current. The charge pump both supplies and sinks current from the current input. It would therefore be supposed that the voltage source needs to be able to provide both a positive and a negative voltage. However, because a negative power supply is in general not available in battery operated equipment it is difficult to generate a voltage proportional to the charge pump current with either polarity. However a suitable alternative can be provided by the arrangement shown in FIG. 9. The buffer 90 and the inverter 92 are used to convert the logic signals which control the current sources 80 and 82 into voltages which are proportional to the charge pump current. Instead of using negative voltage when the negative charge pump (current sink) is used, it is easier to use a logic inverter. Since there are capacitors in series with the voltage input path to the filter, the different DC levels due to the use of the logic inverter is of no consequence. Thus the capacitors effectively provide a DC blocking and level shifting function.

The voltage supply to the logic gates 90 and 92 which are connected directly to the filter must be of a well defined voltage in order to achieve the specific frequency response. Furthermore, the amount of noise on this power supply should be reasonably small in order to achieve a low noise at the output of the filter.

Figure 10A:
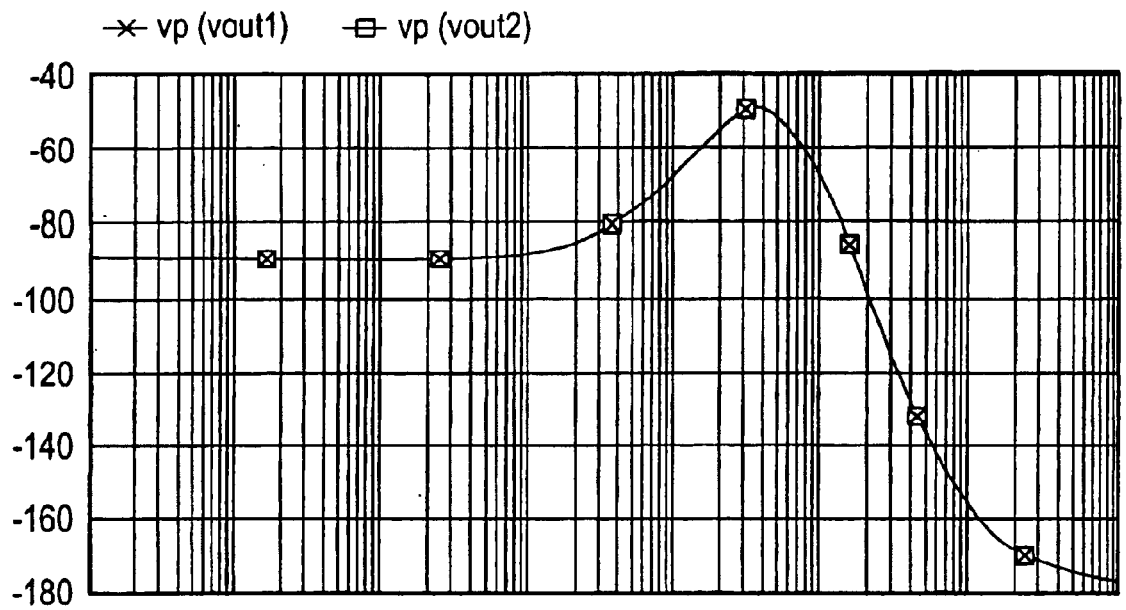
FIG. 10a illustrates the phase response of the circuit shown in FIG. 1 and the equivalent circuit shown in FIG. 9, and FIG. 10b compares the noise Figure of the circuit shown in FIG. 1 and the equivalent circuit shown in FIG. 9.
Figure 10B:
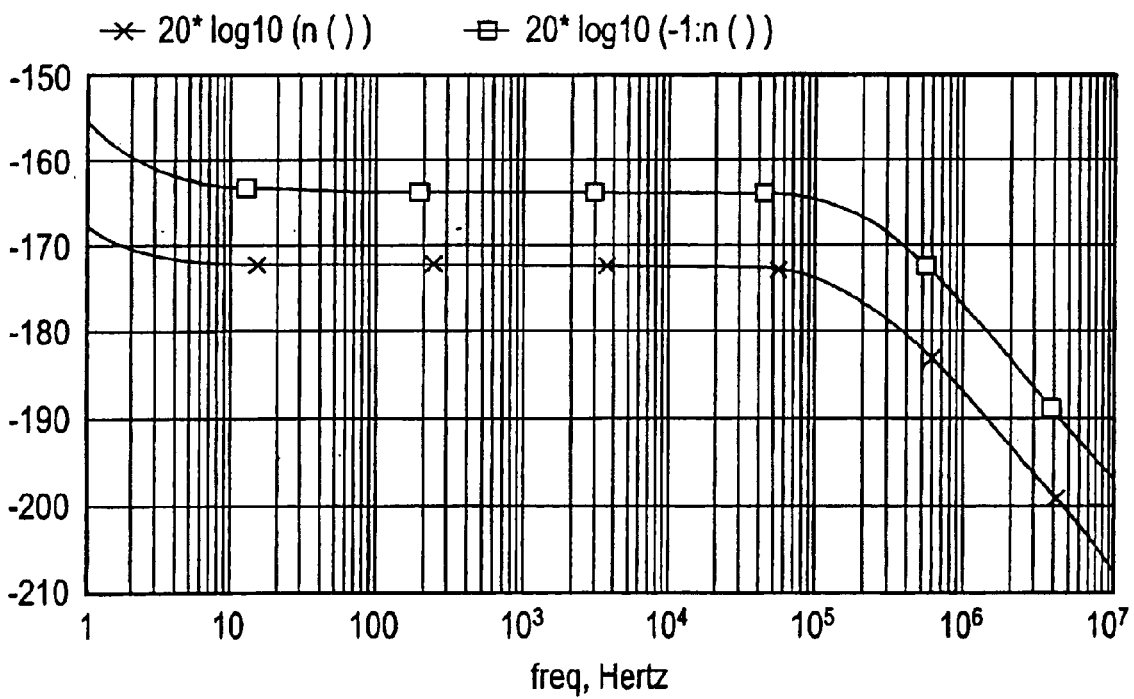
Figure 12:
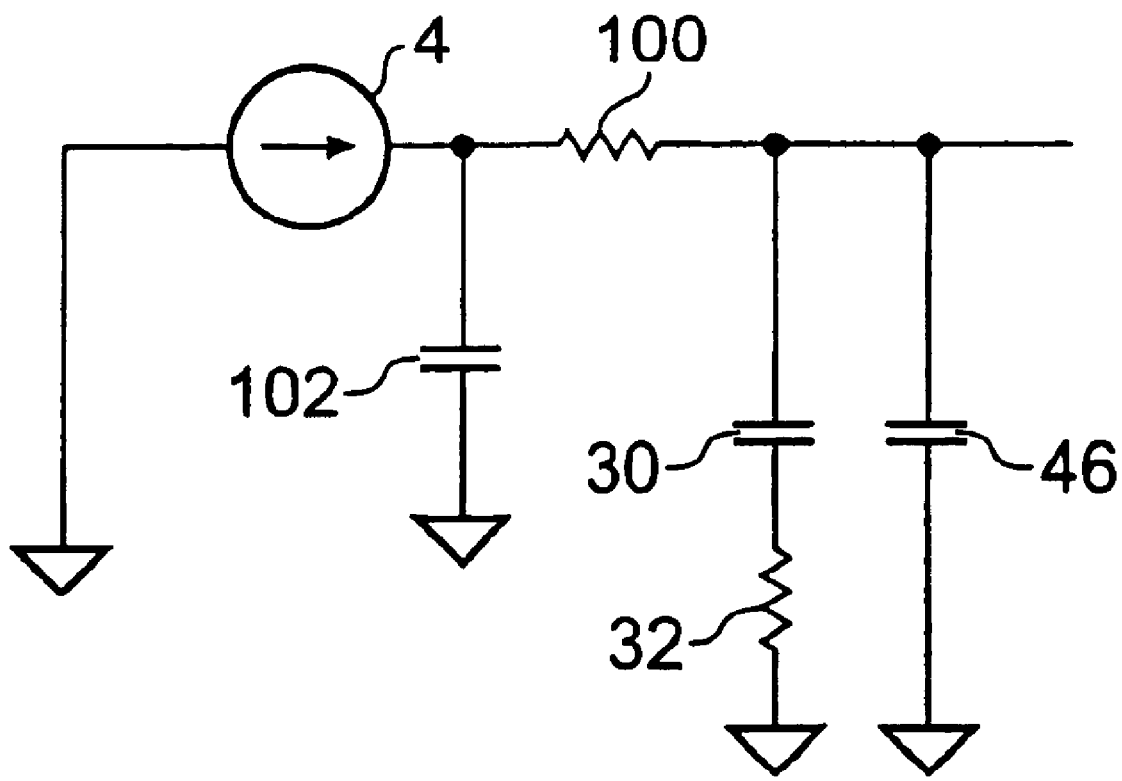
FIG. 12 is a circuit diagram of a filter constituting a further embodiment of the present invention.

FIG. 2 plots not only the response of the original filter in terms of the squares on the graph, but also the response of the arrangement shown in FIG. 9 which are indicated by the crosses on the graph. The amplitude responses of the filters are identical. Furthermore, FIG. 10 *a* shows that the phase responses of the filters are also identical. FIG. 10*b* however, shows that the noise from the new filter is at least 8 dB lower than the noise from the old filter for all frequencies of interest. Furthermore, by inspection of the component values indicated in FIG. 9, the total capacitance of the new filter is around 303 pico farads whereas the total capacitance of the original filter was 30,600 pico farads. Thus superior noise performance is achieved using less than 100th of the capacitance of the old filter and hence given that the fabrication size of the capacitor in the integrated circuit is proportional to its capacitance, it will be seen that the new filter design takes up considerably less chip area than the old filter design thereby making it suitable for fabrication within an integrated circuit.

Many conventional filters, particularly in the context of phase locked loops, have an input which is driven by a current source, and a response at low and medium frequencies which is predominantly determined by a capacitor connected between the current source and a ground, or several capacitors connected between the current source and a ground, some of which may have resistors in series with them. This results in a filter which may have the form of FIG. 6. Such a filter will have an ultimate roll-off of 6 dB per octave. In some applications, a filter is required to have a steeper roll-off at high frequencies. The conventional way to achieve this is to interpose an extra resistor, one terminal being connected to the input current source 4, capacitor 30 and capacitor 46, the other terminal being connected to the output terminal of the filter, and to add an extra capacitor connected between the output terminal of the filter and a ground. This results in a filter having the topology of FIG. 1. Typically, the extra capacitor which has been added will have a value much small than the other capacitors in the filter. An alternative way of achieving an increase in the ultimate slope of the roll-off is to take the circuit of FIG. 6, and interpose a resistor 100 between the input current source 4 and the junction of capacitors 30 and 46. A new capacitor 102 is then added with one terminal connected to the junction of the new resistor and the input current source 4, and the other terminal connected to a ground. This configuration may have a noise voltage at its output which is significantly lower than that which would be present at the output of the conventional circuit. The components added in the new circuit can have similar values to the ones which would be added in the conventional circuit and the frequency response can be made similar or identical to that of the conventional circuit. Because the capacitor between the input current source and ground has a much smaller value than the capacitor from the output terminal to ground, any noise current due to Johnson noise in the new resistor will develop a voltage across the capacitor at the output which is much smaller than the voltage developed across the capacitor at the input. In this way, the majority of the noise voltage of the new resistor will not be present at the output of the filter which is an advantage over the conventional filter. The modifications can also be though of in terms of swapping the input and output terminals of the filter in FIG. 1, although the input signal is still a current and the output signal is still a voltage. In the case of the filter of FIG. 1, the noise voltage is reduced by at least 9 dB. A potential difficulty with the new scheme is that the signal source (charge pump etc.) may be required to operate with a wider range of voltages present on the input terminal of the filter, in other words it may be required to have a greater compliance range. In many applications this will not be a significant problem.

What is claimed is:

1. A filter having a first input for receiving current from a charge pump and an output, and wherein the filter further comprises a second input for receiving a voltage from a voltage source, the voltage source arranged such that a voltage from the voltage source is proportional to the current delivered from the charge pump, a first capacitor connected between the output and a ground connection, a second capacitor connected between the second input and the output, and a connection between the first input and the output.

2. A filter as claimed in claim 1, further including a resistor in series with the second capacitor.

3. A filter as claimed in claim 2, in which the resistor is connected between the second capacitor and the output.

4. A filter as claimed in claim 1, further comprising an additional low pass filter section implemented as a first resistor-capacitor combination at the first input and as a second resistor-capacitor combination at the second input.

5. An integrated circuit including a filter as claimed in claim 1.

6. A phase locked loop synthesiser including a filter as claimed in claim 1.

7. A filter as claimed in claim 4, in which the resistor-capacitor combination at the first input comprises a third capacitor connected between the first input and a ground and a first filter resistor connected between the first input and the output, the resistor-capacitor combination at the second input comprises a second filter resistor connected between the second capacitor and the second input and a fourth capacitor connected between ground and a node connecting the second capacitor to said second filter resistor.

8. A filter implemented within an integrated circuit, the filter comprising an input for receiving current from a charge pump and an output, and wherein the filter further comprises a controllable voltage source, the controllable voltage source being so constructed that there is a change in voltage produced by the voltage source that is directly proportional to any change in the current from the charge pump, a first capacitor connected between the output and a ground connection, a second capacitor, connected between an output of the voltage source and the output terminal, and the input being connected to the output terminal.

9. A filter as claimed in claim 1, where the input and the output are connected together.

10. A filter as claimed in claim 2, in which at the first input a third capacitor is connected between the first input and a ground, and a resistor is connected between the first input and the output and in which another resistor is connected between the second capacitor and the second input, and a fourth capacitor is connected between ground and a node connecting the second capacitor to said another resistor.

* * * * *